United States Patent [19]

Gelbart

[11] Patent Number: 5,517,359
[45] Date of Patent: May 14, 1996

[54] APPARATUS FOR IMAGING LIGHT FROM A LASER DIODE ONTO A MULTI-CHANNEL LINEAR LIGHT VALVE

[76] Inventor: Daniel Gelbart, 4987 Marguerite Street, Vancouver, British Columbia, Canada, V6M 3J9

[21] Appl. No.: 376,494

[22] Filed: Jan. 23, 1995

[51] Int. Cl.⁶ .................................................. G02B 27/10
[52] U.S. Cl. .................................... 359/623; 359/619
[58] Field of Search .................................. 359/619, 621, 359/622, 623, 624; 372/101; 385/33, 34, 119

[56] References Cited

U.S. PATENT DOCUMENTS

| | | | |
|---|---|---|---|
| 4,185,891 | 1/1980 | Kaestner | 350/167 |
| 4,577,932 | 3/1986 | Gelbart | 350/358 |
| 5,080,706 | 1/1992 | Snyder | 65/102 |

FOREIGN PATENT DOCUMENTS 5-30556  5/1993  Japan.

*Primary Examiner*—Georgia Y. Epps
*Assistant Examiner*—Dawn-Marie Bey

[57] ABSTRACT

An apparatus for coupling a broad emitting area laser diode made of multiple emitters operating in parallel to a linear light valve. The apparatus images each one of the emitters onto the linear light valve, superimposing them in order to increase the immunity to defects occuring in any individual emitter.

8 Claims, 2 Drawing Sheets

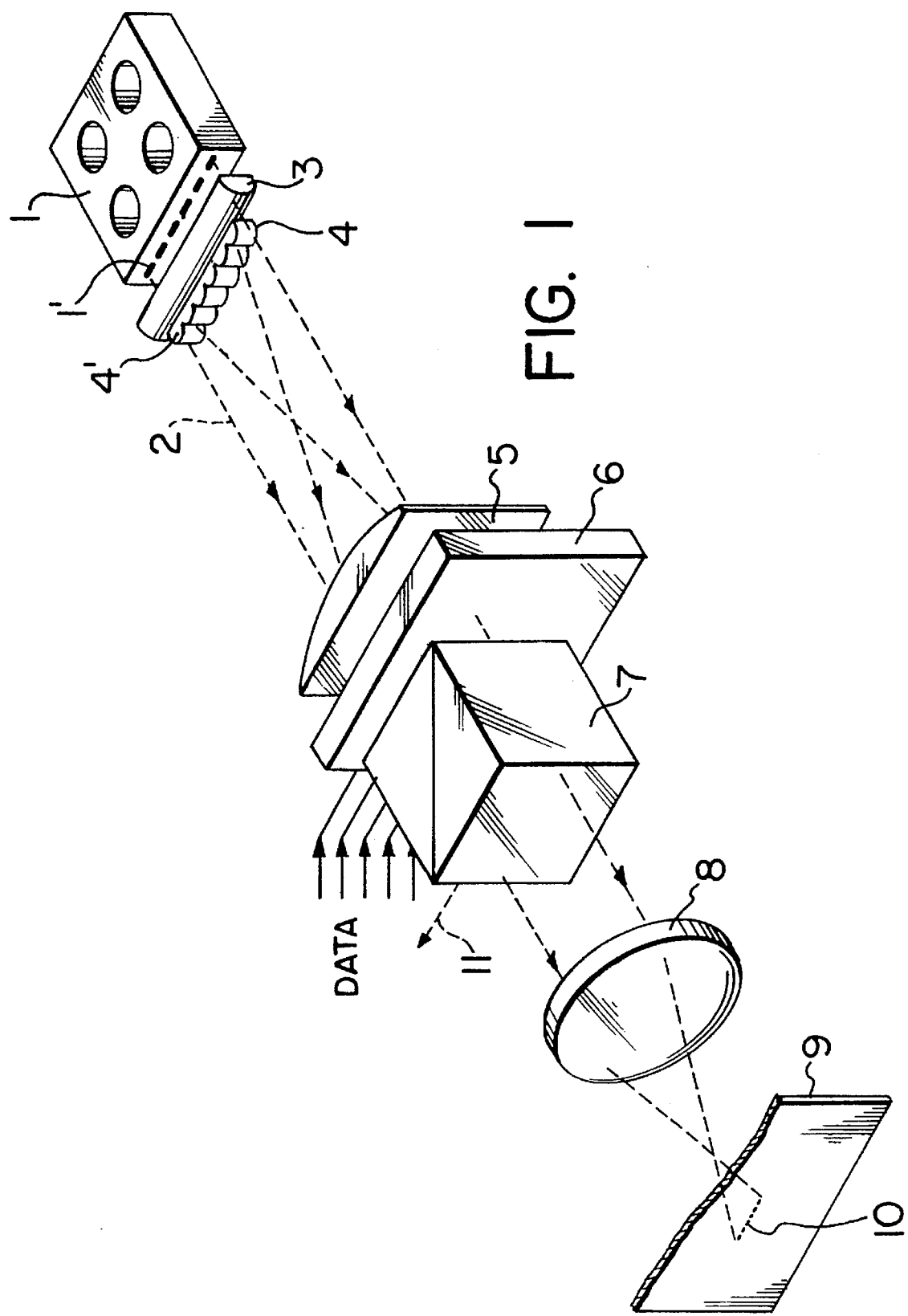
FIG. I

APPARATUS FOR IMAGING LIGHT FROM A LASER DIODE ONTO A MULTI-CHANNEL LINEAR LIGHT VALVE

FIELD

The present invention relates to multi-channel modulators, which are an alternative to individually addressable multi-element laser diodes.

BACKGROUND

In order to increase the power and data rates available from laser diodes, multi-element, individually addressable arrays of laser diodes are sometimes used. These can be of the diffraction-limited single-mode type or arrays of broad area emitters. The broad area emitters are diffraction-limited in one dimension, referred to as the "narrow" dimension and act as a wide area source in the other, or "wide" dimension. The advantage of the broad area emitters, also referred to as "stripe" laser diodes, is the much higher output power possible. Because of this high power, these devices are manufactured with their positive side bonded to the heat sink, since the thermal conductivity of the substrate material is much lower than that of the heat sink. Since the connections to the individual diodes also have to come out from the positive side, there is a conflict, and a compromise, between the heat sinking needs and the interconnections.

A further problem with multi-element, individually addressable diodes is reliability. Since each diode is focused onto a separate modulator cell and then onto a light sensitive material or sensor, a failure or defect in any one of the many elements renders the device useless. Prior art attempts to overcome these problems by coupling a wide area laser diode to a multi-channel modulator were only partially successful since they required a high degree of collimation in both axes. The wide area laser diodes can only be collimated in one axis. As an example of prior art, U.S. Pat. No. 4,577,932 uses a wide area laser diode and an acousto-optic modulator. However, it is limited to operation in a pulsed mode and to relatively narrow diodes.

It is an object of this invention to utilize very wide area laser diodes (typically 10 mm wide) in conjunction with electro-optic multi-channel modulators to form the equivalent of a multi-element individually addressable laser diode but without the limitation of such a device. Such wide area diodes are constructed from a plurality of small elements in parallel, i.e., the elements are not individually addressable.

Another object is to have a device with higher reliability than a multi-element individually addressable diode by eliminating the trade-off between interconnection and heat sinking and by eliminating the effects of data dependent thermal cycling. Reliability is further enhanced by being tolerant to local defects and failures since the near field radiation from the diode is not being imaged in the long dimensions of the diode.

Still another object is to provide multi-channel laser diode systems which are less susceptible to back reflection (from the material being exposed) than laser diodes having narrow emitters.

SUMMARY OF THE INVENTION

The present invention relates to apparatus for imaging light from a laser diode onto a multi-channel linear light valve which includes a broad emitting area laser diode having multiple emitters operating in parallel to the linear light valve. A lenslet array is positioned next to the laser diode so as to image each one of the emitters onto the light valve with all images of the emitters superimposed in order to increase the immunity to defects occurring in any individual emitter. Means for collimating light from the emitters in a direction perpendicular to a direction of collimation of light from the emitters by the lenslet array is provided. The array of lenslets has a pitch less than but substantially equal to the pitch of the emitters and the focal length of the lenslet array is approximately equal to the distance from the emitters to a position where light beams from the emitters start overlapping. Use of a lenslet array allows a significantly greater number of channels than is possible by fabrication of a multi-element individually addressable laser diode.

In another aspect of the invention there is provided a multi-channel modulator for modulating light from a broad emitting laser diode made of multiple emitters which includes a light valve for modulating light incident thereon in response to input data received by control inputs of the light valve. A lenslet array is positioned proximate the emitters having a pitch less than but substantially equal to the pitch of the emitters and a focal length being approximately equal to the distance from the emitters to a position where beams from the emitters start overlapping. Means may be provided for focusing modulated light from the light valve onto a heat or light sensitive material.

By so superimposing the light from each emitter, should one emitter fail, one needs merely to increase slightly the power output from the multiple emitters to compensate for the loss without having to discard the entire laser diode.

An elongated cylindrical microlens may be used for collimating light from the laser diode in a first dimension and the lenslet array to focus light from the diode in a second dimension perpendicular to the first dimension so that light from each lenslet is superimposed at the light valve on light from each of the other lenslets of the lenslet array.

The laser diode may have a plurality of emitters connected in parallel and the lenslet array may have one emitter for each lenslet of the array and each lenslet may be cylindrical with an axis perpendicular to the axis of the elongated cylindrical microlens. The pitch of each of the lenslets may be slightly smaller than the pitch of each of the laser diode emitters.

Preferably, there is provided mirror means for reflecting light from the focusing means so as to superimpose light forming a sloping portion of the intensity profile on one side onto light forming a sloping portion of the intensity profile on the other side so as to provide an approximate rectangular intensity profile at the light valve. By arranging to utilize the sloping portion of the ends of the intensity profile, a greater portion of the output light from the diodes can be utilized and hence result in a significantly greater laser power utilization.

In order to achieve the above objectives and others, all of the elements in the laser diode are connected in parallel to form a single laser diode. The diode is imaged onto a multi-channel electro-optic modulator which sub-divides the diode image into a large number of independent channels.

In order to achieve a high coupling efficiency between the laser diode and the modulator, a cylindrical lens is used for the "narrow" dimension, a lens array is used for the "wide" dimension, and folding mirrors are used to make the illumination or intensity profile more rectangular. Using these steps, a coupling efficiency approaching 90% between the laser diode and the modulator can be achieved.

BRIEF DESCRIPTION OF THE DRAWINGS

For a more complete understanding of the invention, reference may be had to the following detailed description in conjunction with the drawings, wherein:

FIG. 1 is a perspective view of a preferred embodiment of the invention;

FIG. 2-b is a side view of the embodiment of FIG. 1;

DETAILED DESCRIPTION WITH REFERENCE TO THE DRAWINGS

Figure 2A:
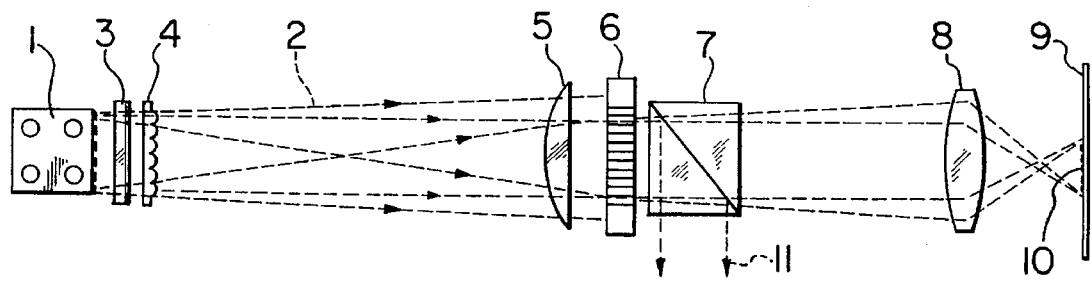
FIG. 2-a is a top view of the embodiment of FIG. 1.

Referring now to FIG. 1, a high power laser, wide emission area, laser diode 1 emits a light beam 2 which is collimated in the vertical dimension by a cylindrical microlens 3. In the preferred embodiment lens 3 is a drawn aspheric lens as described in U.S. Pat. No. 5,080,706. A second microlens 4 is a linear array of cylindrical lenslets 4' aligned with the multiple emitters 1' of laser diode 1. The light from lenslets 4' is collimated by cylindrical lens 5 and imaged as a line on linear light valve 6.

When a high power laser is used, linear light valve 6 is a PLZT device, causing the state of the polarization of the light to rotate when a voltage is applied to electrodes on the PLZT material. A polarizer prism 7 transmits the light of horizontal polarization (i.e. light passing through non-activated cells of the PLZT linear array) and reflects the light 11 whose polarization got changed by passing through the activated PLZT cells. The image on heat or light sensitive material 9 will have portions without illumination corresponding to portions of the light valve 6 having a voltage applied to electrodes of the PLZT cell. The light valve is not part of the invention and will not be discussed in detail; the invention will work with any type of light valve such as magneto-optical, deformable mirror device, ferro-electric liquid crystal and others. Linear light valves are available from Semetex (Torrance, Calif.), Motorola (Albuquerque, N. Mex.), Displaytech (Boulder, Colo.), Texas Instruments (Dallas, Tex.) and others. An imaging lens 8 images light valve 6 onto heat sensitive (or light sensitive) material 9, forming an image 10. Image 10 is a reduced image of the linear light valve 6.

In order to achieve immunity to local defects in the laser diode 1', the focal length and pitch of lenslets 4' in microlens 4 are selected to image each emitter 1' of diode 1 onto the complete width of light valve 6. The number of lenslets 4' is equal to the number of laser diode emitters 1'. The pitch of cylindrical lenslets 1' is slightly smaller than the pitch of the laser diode emitters in order to cause the image of all emitters 1' to overlap at the light valve 6. For best brightness, the focal length of lenslets 4' should be about equal to the distance from the diode face to where the beams from individual emitters 1' cross over.

Figure 2B:
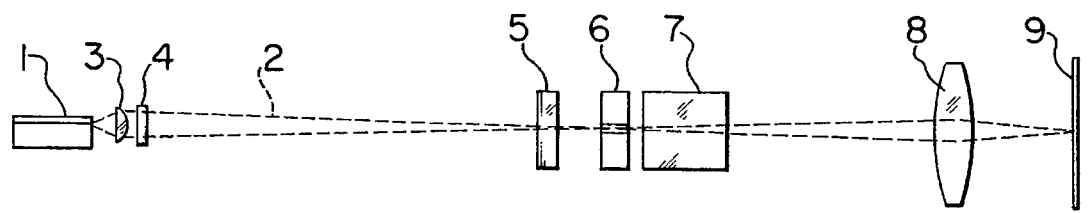

Referring now to FIG. 2-a and 2-b in conjunction with FIG. 1, the images of all emitters 1' are overlapped onto light valve 6 in the form of a line. The intensity of this line is uniform for most of its length since emitters 1' of diode 1 are broad area emitters. These emitters typically radiate uniformly across their width but fall off at the ends. This line, modulated by light valve 6, is imaged onto heat (or light) sensitive material 9. In most applications, diode 1 operates at the infra-red part of the spectrum, typically between 800 nm to 850 nm, and material 9 is heat sensitive rather than sensitive to a specific wavelength. Operation of the same device in the visible spectrum, using a visible laser diode, is also possible.

Figure 3:
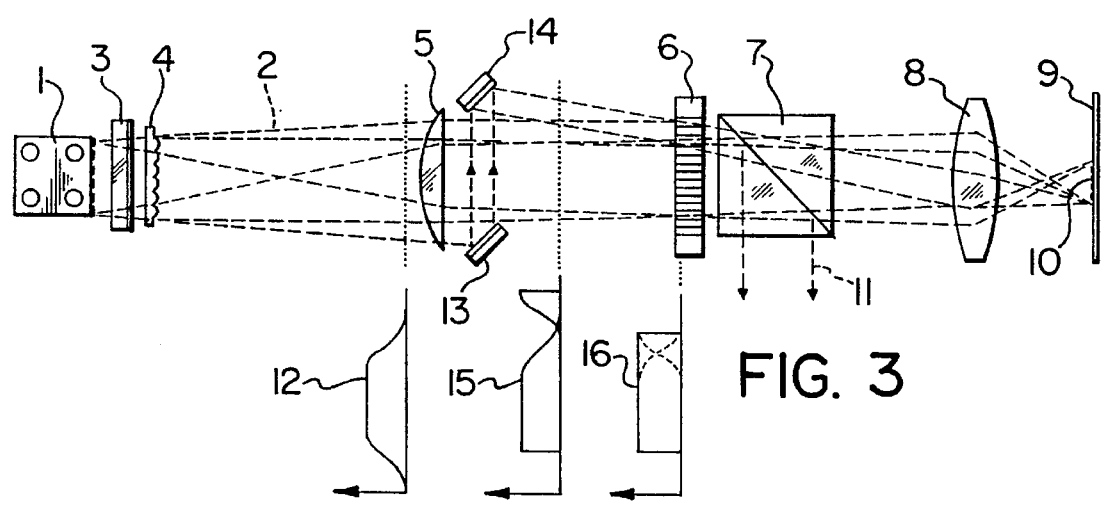
FIG. 3 is a top view of the embodiment of FIG. 1 incorporating the "folding over" of the intensity profile to increase power utilization.

Referring now to FIG. 3, graph 12 shows the intensity profile of the illumination resulting from superimposing the images of all emitters of laser diode 1 using lenslet array 4. The same profile also applies to FIG. 2-a. This profile is also the profile of each emitter 1', as the images are overlapped accurately. Only the flat part of the profile can be utilized as the light valve 6 needs to be uniformly illuminated. The sloping ends of the illumination profile represent a power loss of between 30% and 40% of the total power. In order to utilize that power, the improvement shown in FIG. 3 is used. A mirror 13 reflects the sloping part of intensity profile 12 onto a second mirror 14. Mirror 14 superimposes this part of the profile onto the sloping profile at the other end of the illuminating line, as shown by graph 15. This graph depicts the intensity profile immediately after mirror 14. By adjusting the angle of mirror 14 to overlap the sloping part of the profiles on the light valve 6, a nearly rectangular profile 16 is achieved. This method generates a slightly higher angular spread than FIG. 2-a but increases laser power utilization significantly.

Since the line projected onto light valve 6 is a superposition of many emitters (typically 10 to 40) of laser diode 1, a failure of any emitter does not create a dark spot on the light valve. Instead, the total illumination decreases. By the way of example, for a 20 emitter diode, a single defective emitter will reduce the illumination to the light valve by 5%. This uniform drop in illumination can be easily compensated for by increasing the current of the laser diode.

By the way of example, laser diode 1 is a 20 W C diode made by Opto-Power (City of Industry, Calif.), part number OPC-B020-80-CS. It has 19 emitters, each emitter 150 micron long, on 787.5 micron centres. These dimensions leave 637.5 microns between emitters. Since the divergence in the wide dimension of this diode is about 10°, the beams from the individual emitters cross over about 637.5/tan 10°=3.6 mm from the diode. This determines the focal length of lens 4. Cylindrical microlens 3 is a drawn cylindrical lens, with a numerical aperture of 0.73, made by Blue Sky Research (San Jose, Calif.), part number SAC 800. Lenslet array 4 is made up of 19 diffractive cylindrical microlenses, on a pitch of 785 microns and a focal length of 3.5 mm, made by Teledyne Brown Engineering (Huntsville, Ala.) using a 16 step (4 mask) process. Cylindrical lens 5 has a focal length of about 250 mm. These dimensions are sufficient to illuminate a light valve 6 mm wide when the configuration of FIG. 2-b is used and about 10 mm wide using the configuration of FIG. 3. The distance between lens 5 and lens 4 is about 250 mm. The distance between lens 4 and the laser diode emitters is about 3.8 mm. Lens 3 is adjusted to image the sharpest line, in the vertical dimension, on light valve 6. Since the pitch of the cylindrical microlenses of lens 4 is slightly smaller than the pitch of the emitters of laser diode 1 (776.3 microns vs. 787.5 microns), the images of all emitters are superimposed as a distance of about 250 mm, since the accumulated displacement of the end emitters is 9×(787.5−776.3)≈100 microns, giving an image displacement of (100/3600) 250 mm≈7 mm. By placing the light valve at this distance, the objectives of the invention are achieved.

Accordingly, while this invention has been described with reference to illustrative embodiments, this description is not intended to be construed in a limiting sense. Various modifications of the illustrative embodiments, as well as other embodiments of the invention, will be apparent to persons skilled in the art upon reference to this description. It is therefore contemplated that the appended claims will cover any such modifications or embodiments as fall within the true scope of the invention.

I claim:

1. Apparatus for imaging light from a laser diode onto a multi-channel linear light valve, comprising:
   (a) a broad emitting area laser diode having multiple emitters operating in parallel to said linear light valve;
   (b) a lenslet array positioned next to said laser diode so as to image each one of said emitters onto said light valve with all images of said emitters superimposed in order to increase the immunity to defects occurring in any individual emitter; and
   (c) means for collimating light from said emitters in a direction perpendicular to a direction of collimation of light from said emitters by said lenslet array;
   wherein said array of lenslets has a pitch less than but substantially equal to the pitch of said emitters and the focal length of said lenslet array being approximately equal to the distance from said emitters to a position where light beams from said emitters start overlapping.

2. Apparatus according to claim 1, including mirror means for reflecting light from said emitters so as to superimpose light forming a sloping portion of a light intensity profile on one side onto light forming a sloping portion of a intensity profile on the other side and, thus, provide an approximate rectangular profile at said light valve.

3. Apparatus according to claim 1, wherein the focal length of each lenslet in said lenslet array equals the distance between emitters divided by the tangent of the angular divergence in the wide dimension of each emitter.

4. A multi-channel modulator for modulating light from a broad emitting laser diode made of multiple emitters, comprising:
   (a) a light valve for modulating light incident thereon in response to input data received by control inputs of said light valve;
   (b) a lenslet array positioned proximate said emitters having a pitch less than but substantially equal to the pitch of said emitters and a focal length being approximately equal to the distance from said emitters to a position where beams from said emitters start overlapping;
   (c) means for collimating light from said emitters in a direction perpendicular to the direction of collimation by lenslets of said lenslet array; and
   (d) means for focusing modulated light from said light valve onto a heat or light sensitive material,
   wherein each one of said emitters is imaged onto said light valve so as to be superimposed and thereby increase the immunity to defects occurring in any individual emitter.

5. A modulator according to claim 4, wherein said collimating means is a cylindrical microlens.

6. A modulator according to claim 4, including a mirror assembly positioned on either side of said focusing means so as to superimpose light forming a sloping portion of an intensity profile on one side onto light forming a sloping portion of an intensity profile on the other side so as to provide an approximate rectangular profile at said light valve.

7. A modulator according to claim 5, wherein said laser diode has a plurality of emitters connected in parallel and said lenslet array has one emitter for each lenslet of said array and each lenslet is cylindrical with an axis perpendicular to the axis of said elongated cylindrical microlens.

8. A modulator according to claim 4, wherein the focal length of each of lenslets in said lenslet array equals the distance between emitters divided by the tangent of the angular divergence in the wide dimension of each emitter.

* * * * *